(12) United States Patent
Huang

(10) Patent No.: US 6,831,335 B2
(45) Date of Patent: Dec. 14, 2004

(54) MEMORY DEVICE HAVING BURIED SOURCE/DRAIN REGION AND FABRICATION THEREOF

(75) Inventor: Shui-Chin Huang, Tainan (TW)

(73) Assignee: Macronix International Co., Ltd., Hsinchu (TW)

(*) Notice: Subject to any disclaimer, the term of this patent is extended or adjusted under 35 U.S.C. 154(b) by 28 days.

(21) Appl. No.: 10/410,975

(22) Filed: Apr. 9, 2003

(65) Prior Publication Data

US 2003/0199142 A1 Oct. 23, 2003

Related U.S. Application Data

(62) Division of application No. 10/050,082, filed on Jan. 15, 2002, now Pat. No. 6,645,816.

(30) Foreign Application Priority Data

Nov. 23, 2001 (TW) .................................... 90129018 A

(51) Int. Cl.⁷ .......................................... H01L 21/8246
(52) U.S. Cl. ...................................... 257/390; 257/391
(58) Field of Search ................................. 257/390–391

(56) References Cited

U.S. PATENT DOCUMENTS 5,572,056 A * 11/1996 Hsue et al. .................. 257/402
5,665,621 A * 9/1997 Hong .......................... 438/278

* cited by examiner

Primary Examiner—H. Jey Tsai
(74) Attorney, Agent, or Firm—J.C. Patents

(57) ABSTRACT

A method of fabricating a memory device having a buried source/drain region is provided, in which a dielectric layer and a word-line is sequentially formed on the substrate, then a buried source/drain region is formed in the substrate. After that, a barrier layer is formed on the exposed surface of the word-line, then a metal layer is formed over the substrate. The metal layer is patterned to leave a portion covering the buried source/drain region beside the word-line and crossing over the word-line.

8 Claims, 5 Drawing Sheets

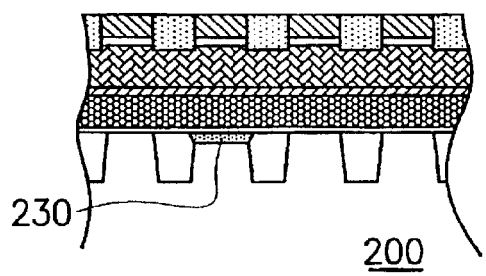
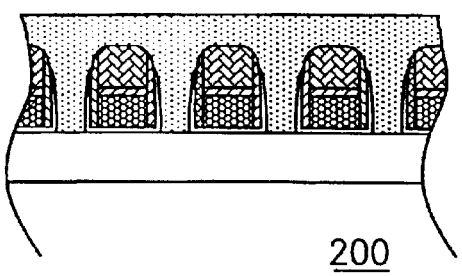
FIG. 9A  FIG. 9B
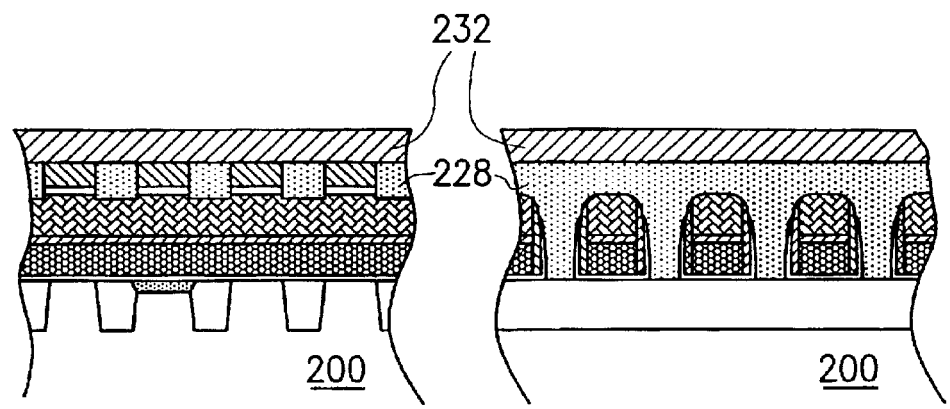
FIG. 10A  FIG. 10B

MEMORY DEVICE HAVING BURIED SOURCE/DRAIN REGION AND FABRICATION THEREOF

This application is a divisional application of, and claims the priority benefit of, U.S. application Ser. No. 10/050,082 filed on Jan. 15, 2002, now U.S. Pat. No. 6,645,816.

CROSS-REFERENCE TO RELATED APPLICATION

This application claims the priority benefit of Taiwan application serial no. 90129018, filed Nov. 23, 2001.

BACKGROUND OF THE INVENTION

1. Field of Invention

The present invention relates to a semiconductor device and the fabrication thereof. More particularly, the present invention relates to a memory device having a buried source/drain region and the fabrication thereof.

2. Description of Related Art

The buried diffusion, e.g., the source/drain region or the buried line, is regularly formed by implanting a high dosage of arsenic ions or phosphorous ions into the substrate and has a sheet resistance usually larger than 50 ohm/cm$^2$. Such a high sheet resistance will slow down the device. For example, the operation speed of a Mask ROM (mask read-only memory) or a NROM (nitride ROM) will be lowered if the buried bit-line having high resistance is used only.

SUMMARY OF THE INVENTION

Accordingly, a memory device having a buried source/drain region and the fabrication thereof are provided in this invention to lower the sheet resistance of the source/drain.

Another object of this invention is to provide a memory device having a buried source/drain region and the fabrication thereof. This method can serve to increase the maximum linewidth of the word-line since the sheet resistance of the source/drain can be lowered even if the buried source/drain region is smaller.

Another object of this invention is to provide a memory device having a buried source/drain region and the fabrication thereof to enhance the operation speed of the memory device.

According to the above-mentioned objects and others, the method of fabricating a memory device having a buried source/drain region in this invention is described as follows. A dielectric layer is formed on a substrate, then a word-line is formed over the substrate, following by a buried source/drain region formed in the substrate. After that, a barrier layer is formed on the exposed surface of the word-line, then a metal layer is formed over the substrate. The metal layer is patterned to leave a portion of the metal layer covering the buried source/drain region beside the word-line and crossing over the word-line. Since the metal layer is formed in parallel connection with the buried diffusion, the sheet resistance of the bit-line structure (metal layer+buried diffusion) is lower than before and the operation speed of the memory device is therefore increased.

This invention also provides a method of fabricating a Mask ROM device. In this method) a dielectric layer is formed on a substrate, then a plurality of buried bit-lines are formed in the substrate and a plurality of word-lines that crossing over the buried bit-lines are formed over the substrate. Afterward, a barrier layer is formed on the exposed surfaces of the word-lines, then a metal layer is formed over the substrate. The metal layer is patterned to leave a portion of the metal layer covering the buried bit-lines beside the word-lines and crossing over the word-lines. Next, a coding process is performed to form a plurality of coding regions in the substrate.

In addition, this invention provides a method of fabricating a NROM (nitride ROM) device. In this method, a plurality of buried bit-lines are formed in the substrate, then a trapping layer, such as an ONO (silicon oxide/silicon nitride/silicon oxide) structure, is formed on a substrate. After that, a plurality of word-lines crossing over the buried bit-lines are formed over the substrate, then a barrier layer is formed on the exposed surfaces of the word-lines and a metal layer is formed over the substrate. The metal layer is patterned to leave a portion of the metal layer covering the buried bit-lines beside the word-lines and crossing over the word-lines.

In the preferred embodiments of this invention, the method of fabricating a Mask ROM device having buried bit-lines is described. In this method, a gate insulator is formed on the substrate, then a plurality of gate structures, which are equal to the word-lines, are formed over the substrate. Subsequently, a barrier layer is formed on the exposed surfaces of the gate structures, then an inter-layer dielectric layer is formed over the substrate. A lithography and implantation process is performed to form a plurality of buried bit-lines in the substrate, then the exposed inter-layer dielectric layer is removed, following by a metal layer formed on the substrate. The metal layer is patterned to leave a portion of the metal layer covering the buried bit-lines beside the word-lines and crossing over the word-lines.

Since a metal layer is formed in parallel connection with the buried diffusion, the sheet resistance of the new conductive structure (metal layer+buried diffusion) is lower than before. Besides, since the sheet resistance of the bit-line can be lowered by the metal layer even if the buried bit-line is narrower, the maximum linewidth of the word-line can be increased and the operation speed can be enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates the layout of the Mask ROM device having buried bit-lines in the preferred embodiments of this invention; and FIGS. 2A~10A and FIGS. 2B~10B schematically illustrate the flow chart of fabricating the Mask ROM device in the preferred embodiments of this invention, wherein FIG. 2A and FIG. 2B schematically illustrate in their left parts the cross-sectional views of the memory device area 20 along the same line I—I in FIG. 1 after the initial steps, while the cross-sectional views of the periphery device area 22 are shown in the right parts of FIG. 2A and FIG. 2B;

FIG. 9A and FIG. 9B are the cross-sectional views of the memory device area along the same line I—I and line II—II in FIG. 1, respectively, after the coding process of the Mask ROM; and FIG. 10A and FIG. 10B are the cross-sectional views of the memory device area along the same line I—I and line II—II in FIG. 1, respectively, after the third interlayer dielectrics is deposited.

DESCRIPTION OF THE PREFERRED EMBODIMENTS

Figure 1:
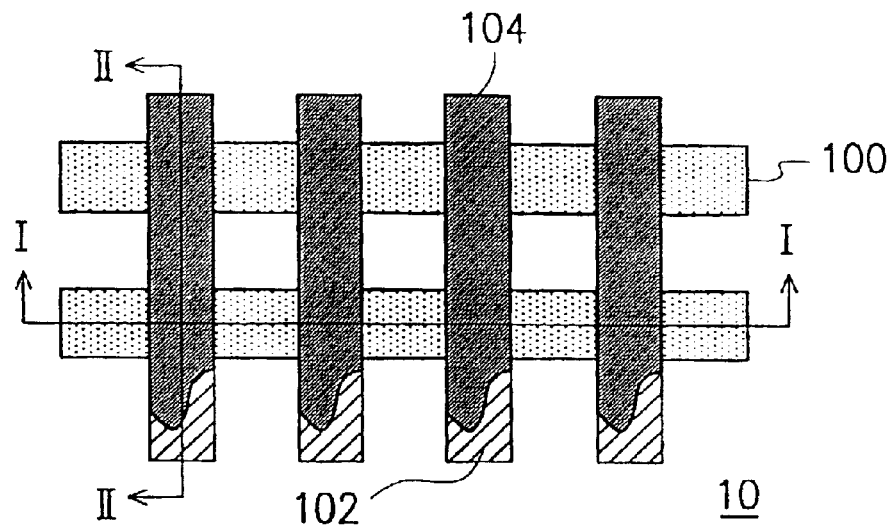

Referring to FIG. 1, which schematically illustrates the layout of the Mask ROM device having buried bit-lines in the preferred embodiments of this invention.

As shown in FIG. 1, the Mask ROM device of this preferred embodiment includes the word-lines 100 on the substrate 10, the buried bit-lines 102 in the substrate 10 and being vertical to the word-lines 100, and the metal layers 104 over the buried bit-lines 102 and crossing over the word-lines 100. The metal layer 104 is in parallel connection with the buried bit-line 102 and is preferably made from tungsten. Then, the process steps of fabricating such a memory device are described in detail in the following paragraphs with the accompanying drawings.

Figure 2A:
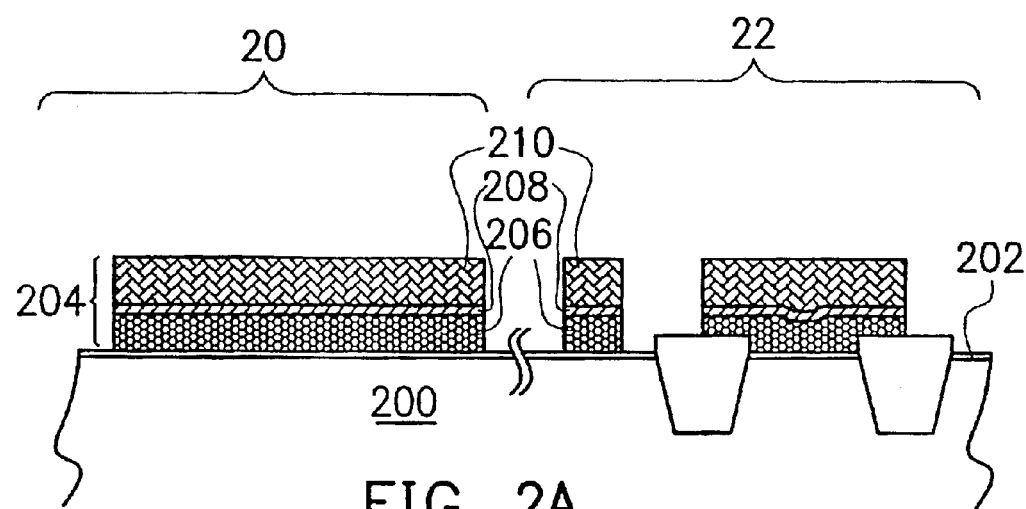
Figure 2B:
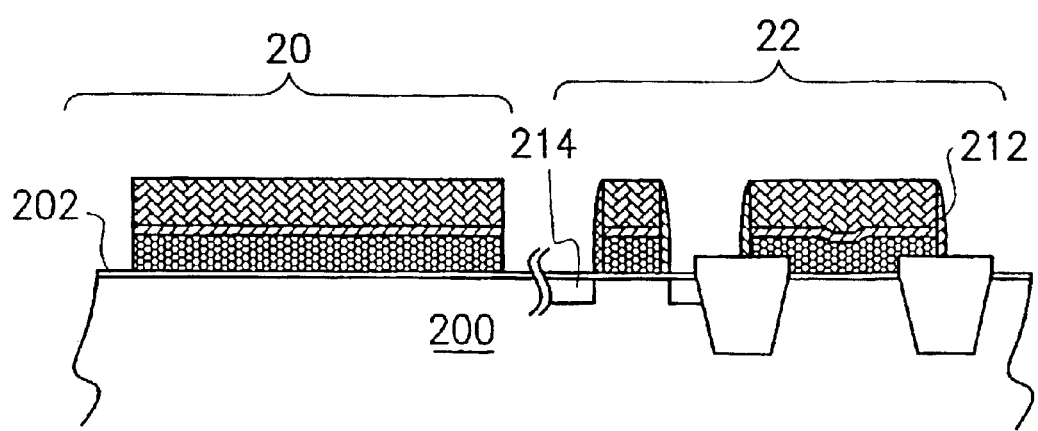

Referring to FIG. 2A and FIG. 2B, which schematically illustrate in their left parts the cross-sectional views of the memory device area 20 along the same line I—I in FIG. 1 after the initial steps, while the cross-sectional views of the periphery device area 22 are shown in the right parts of FIG. 2A and FIG. 2B.

As shown in FIG. 2A and FIG. 2B, a dielectric layer 202 is formed on the substrate 200 to serve as a gate insulator, then the gate structures 204 that act as the word-lines are formed over the substrate 200 and in the memory device area 20. The method of making the gate structures 204 is, for example, to form a conductive layer 206 and a capping layer 210 sequentially over the substrate 200, then pattern the capping layer 210 and the conductive layer 206. The materials of the conductive layer 206 and the capping layer 210 are, for example, polysilicon and silicon nitride, respectively. In addition, it is more preferred to interpose a polycide layer 208 between the conductive layer 206 of polysilicon and the capping layer 210.

Referring to FIG. 2B again, spacers 212 are then formed on the side-walls of the gate structures 204 in the memory device area 20 and in the periphery device area 22, then a source/drain region 214 is formed in the substrate 200 in the periphery device area 22.

Figures 3A, 3B:
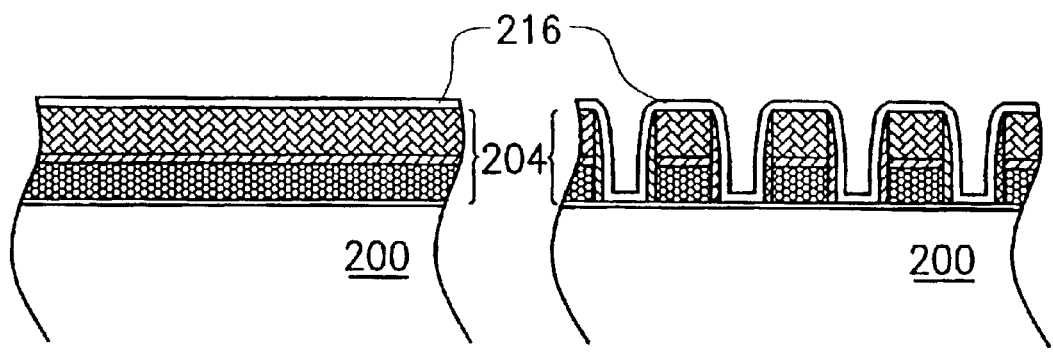
FIG. 3A and FIG. 3B are the cross-sectional views of the memory device area along the same line I—I and line II—II in FIG. 1, respectively, after the barrier layer is deposited.

Referring to FIG. 3A and FIG. 3B, which are the cross-sectional views of the memory device area along the same line I—I and line II—II in FIG. 1, respectively, after the barrier layer is deposited As shown in FIG. 3A and FIG. 3B, a barrier layer 216 is formed over the substrate 200 to cover the gate structures 204, wherein the barrier layer 216 can be a plurality of barrier spacers 216b (see FIG. 7B) formed by depositing and etching back a barrier material layer. The barrier material layer covers the surface of the substrate 200 and the exposed surfaces of the gate structures 204 and comprises, for example, silicon nitride.

Figures 4A, 4B:
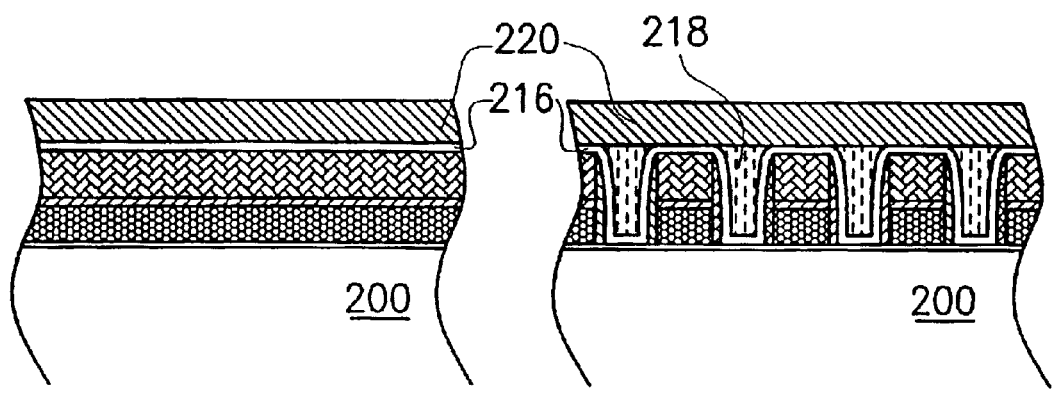
FIG. 4A and FIG. 4B are the cross-sectional views of the memory device area along the same line I—I and line II—II in FIG. 1, respectively, after the first inter-layer dielectrics is deposited and partially etched and after the second inter-layer dielectrics is deposited.

Referring to FIG. 4A and FIG. 4B, which are the cross-sectional views of the memory device area along the same line I—I and line II—II in FIG. 1, respectively, after the first inter-layer dielectrics is deposited and partially etched and after the second inter-layer dielectrics is deposited.

As shown in FIG. 4A and FIG. 4B, a first inter-layer dielectrics (ILD1) 218, such as a silicon oxide layer, is formed on the substrate 200. Afterward, the first interlayer dielectrics 218 is etched until the barrier layer 216 is exposed, which is achieved by, for example, polishing the first inter-layer dielectrics 218 by chemical mechanical polishing (CMP) with the barrier layer 216 as a stop layer. A second inter-layer dielectrics (ILD2) 220, such as a silicon oxide layer, is formed over the substrate 200 to cover the first inter-layer dielectrics 218 and the barrier layer 216.

Figures 5A, 5B:
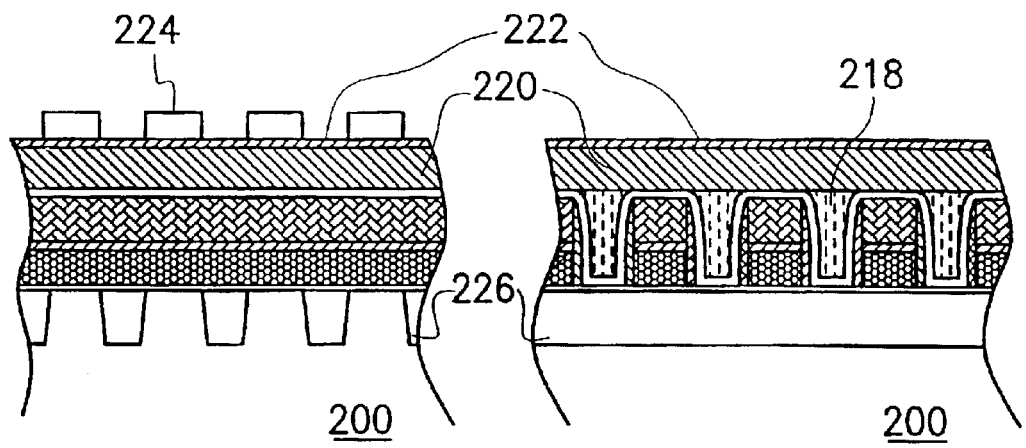
FIG. 5A and FIG. 5B are the cross-sectional views of the memory device area along the same line I—I and line II—II in FIG. 1, respectively, after the lithography and implantation process of the bit-lines.

Referring to FIG. 5A and FIG. 5B, which are the cross-sectional views of the memory device area along the same line I—I and line II—II in FIG. 1, respectively, after the lithography and implantation process of the bit-lines.

As shown in FIG. 5A and FIG. 5B, an anti-reflection coating (ARC) 222 is formed on the second inter-layer dielectrics 220, then a patterned photoresist layer 224 is formed on the anti-reflection coating (ARC) 222, wherein the photoresist layer 224 exposes a portion of the anti-reflection coating 222. Subsequently, the buried bit-lines 226 are formed in the substrate 200 by performing an implantation with the photoresist layer 224 as a mask.

Figures 6A, 6B:
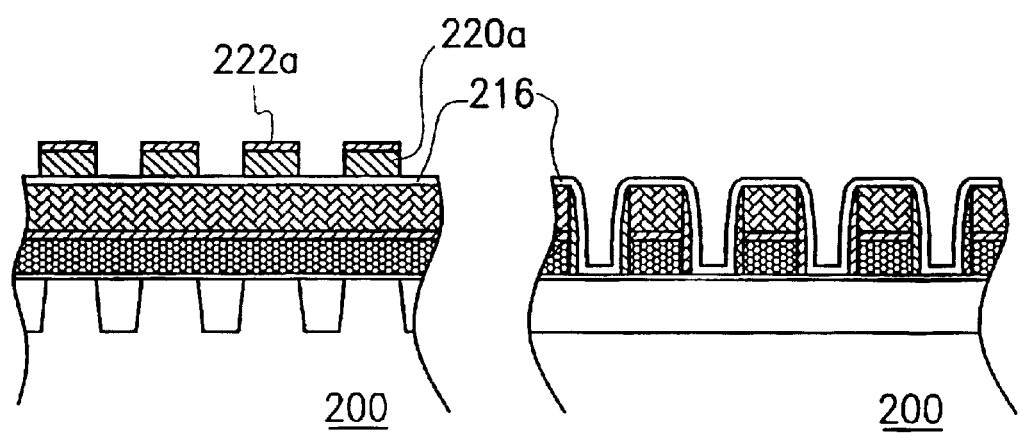
FIG. 6A and FIG. 6B are the cross-sectional views of the memory device area along the same line I—I and line II—II in FIG. 1, respectively, after the first and the second inter-layer dielectrics is partially etched to expose the barrier layer.

Referring to FIG. 6A and FIG. 6B, which are the cross-sectional views of the memory device area along the same line I—I and line II—II in FIG. 1, respectively, after the first and the second inter-layer dielectrics are etched to expose a portion of the barrier layer.

As shown in FIG. 6A and FIG. 6B, the exposed first inter-layer dielectrics 218 and the exposed second inter-layer dielectrics 220 are etched away with the photoresist layer 224 as a mask to expose a portion of the barrier layer 216. After that, the photoresist layer 224 is removed to expose the previously covered portions of the second inter-layer dielectrics 220a and the anti-reflection coating 222a.

Figures 7A, 7B:
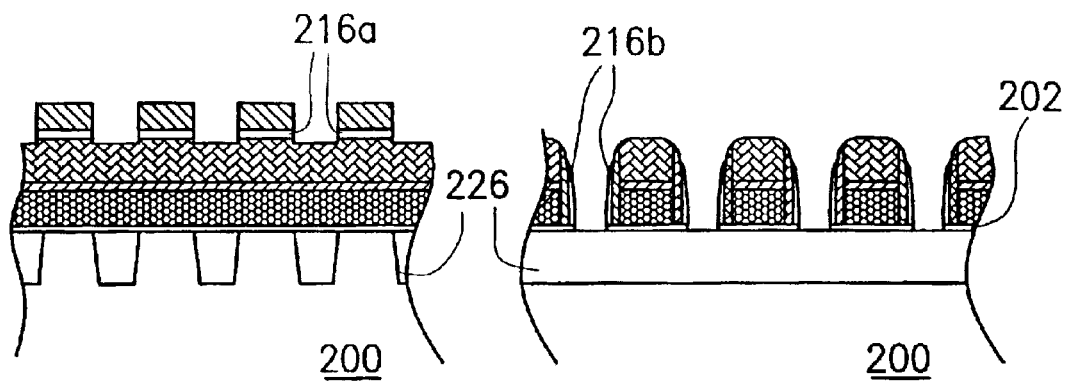
FIG. 7A and FIG. 7B are the cross-sectional views of the memory device area along the same line I—I and line II—II in FIG. 1, respectively, after the barrier layer is partially etched.

Referring to FIG. 7A and FIG. 7B, which are the cross-sectional views of the memory device area along the same line I—I and line II—II in FIG. 1, respectively, after the barrier layer is partially etched.

As shown in FIG. 7A and FIG. 7B, a portion of the exposed barrier layer 216 is etched away, then the etching process is continued to remove the exposed gate insulator 202 and to expose a portion of the buried bit-lines 226.

Figures 8A, 8B:
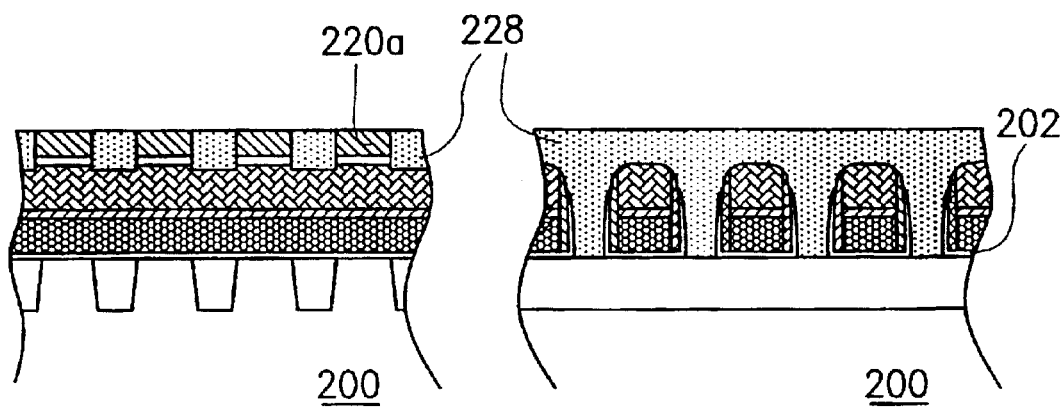
FIG. 8A and FIG. 8B are the cross-sectional views of the memory device area along the same line I—I and line II—II in FIG. 1, respectively, after the metal layer is deposited and partially etched.

Referring to FIG. 8A and FIG. 8B, which are the cross-sectional views of the memory device area along the same line I—I and line II—II in FIG. 1, respectively, after the metal layer is deposited and partially etched.

As shown in FIG. 8A and FIG. 8B, the remaining anti-reflection coating 222a is removed, then a metal layer 228, which preferably comprises tungsten, is formed over the substrate 200. After that, the metal layer 228 is etched until the second inter-layer dielectrics 220a is exposed, which can be done by, for example, polishing the metal layer 228 by chemical mechanical polishing (CMP) with the second inter-layer dielectrics 220a as a stop layer.

Referring to FIG. 9A and FIG. 9B, which are the cross-sectional views of the memory device area along the same line I—I and line II—II in FIG. 1, respectively, after the coding process of the Mask ROM.

As shown in FIG. 9A and FIG. 9B, a coding process is then performed to form a ROM code 230 in the substrate 200. Alternatively, the coding process can be performed before the buried bit-lines 226 are formed in the substrate 200.

Referring to FIG. 10A and FIG. 10B, which are the cross-sectional views of the memory device area along the same line I—I and line II—II in FIG. 1, respectively, after the third inter-layer dielectrics is deposited.

As shown in FIG. 10 and FIG. 10B, a third inter-layer dielectrics 232 is then formed over the substrate 200. The following back-end process is omitted here since it should be well known to those skilled in the art.

Since a metal layer is formed in parallel connection with the buried diffusion, such as a buried bit-line 226, in this invention, the sheet resistance of the whole bit-line (buried bit line +metal layer) is lower than before. Besides, since the sheet resistance of the whole bit-line can be lowered even if the buried bit-line is narrower, the maximum linewidth of the word-line can be increased and the operation speed of the memory device can be enhanced.

It will be apparent to those skilled in the art that various modifications and variations can be made to the structure of the present invention without departing from the scope or spirit of the invention, In view of the foregoing, it is intended that the present invention covers modifications and variations of this invention provided they fall within the scope of the following claims and their equivalents.

What is claimed is:

1. A memory device comprising:

a word-line on a substrate;

a buried bit-line in the substrate perpendicular to the word-line;

a dielectric layer between the word-line and the substrate;

a metal layer crossing over the word-line and being in parallel connection with the buried bit-line; and a barrier spacer between the word-line and the metal layer.

2. The memory device of claim 1, wherein the metal layer comprises tungsten.

3. The memory device of claim 1, wherein the word-line comprises polysilicon.

4. The memory device of claim 1, wherein the barrier spacer comprises silicon nitride.

5. The memory device of claim 1, wherein the word-line comprises:

a conductive layer;

a cap layer on the conductive layer; and a spacer on side-walls of the cap layer and the conductive layer.

6. The memory device of claim 5, wherein the conductive layer comprises polysilicon.

7. The memory device of claim 6, further comprising a polycide layer between the conductive layer and the cap layer.

8. The memory device of claim 5, wherein the cap layer comprises silicon nitride.

* * * * *